United States Patent
He et al.

(10) Patent No.: US 7,058,540 B2
(45) Date of Patent: Jun. 6, 2006

(54) METHOD AND SYSTEM FOR ACCELERATING POWER COMPLEMENTARY CUMULATIVE DISTRIBUTION FUNCTION MEASUREMENTS

(75) Inventors: Yi He, Santa Rosa, CA (US); Gerald J. Ringel, Marysville, WA (US); Howard E. Hilton, Snohomish, WA (US); Brian Barton, Lake Stevens, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 78 days.

(21) Appl. No.: 10/737,050

(22) Filed: Dec. 15, 2003

(65) Prior Publication Data

US 2005/0143982 A1  Jun. 30, 2005

(51) Int. Cl.
G06F 15/00 (2006.01)
G06F 7/38 (2006.01)
(52) U.S. Cl. .................. 702/180; 336/75; 370/252; 708/490; 712/14
(58) Field of Classification Search ............... 702/180, 702/186, 187; 712/14, 22; 330/75; 370/252; 708/490, 517; 704/216
See application file for complete search history.

(56) References Cited

U.S. PATENT DOCUMENTS

| | | | |
|---|---|---|---|
| 6,226,271 B1 * | 5/2001 | Dent | 370/252 |
| 6,275,920 B1 * | 8/2001 | Abercrombie et al. | 712/14 |
| 2004/0024801 A1 * | 2/2004 | Hamilton et al. | 708/490 |
| 2005/0057303 A1 * | 3/2005 | Leffel | 330/75 |

* cited by examiner

Primary Examiner—John Barlow
Assistant Examiner—John Le

(57) ABSTRACT

Data values representing the ($I^2+Q^2$) values are converted to floating-point representations and a histogram of the floating-point numbers is generated. The count for each histogram bin in the histogram is stored in a memory. Each floating-point number acts as an address for a corresponding histogram bin in the memory. The accumulated counts in the histogram bins are then grouped into a desired number of CCDF bins, and the CCDF curve is derived from the histogram data. Grouping the histogram bins into the CCDF bins may include combining one or more histogram bins into a single CCDF bin. Linear interpolation is used to divide a count value in a histogram bin between two CCDF bins when the histogram bin does not align with a single CCDF bin.

20 Claims, 5 Drawing Sheets

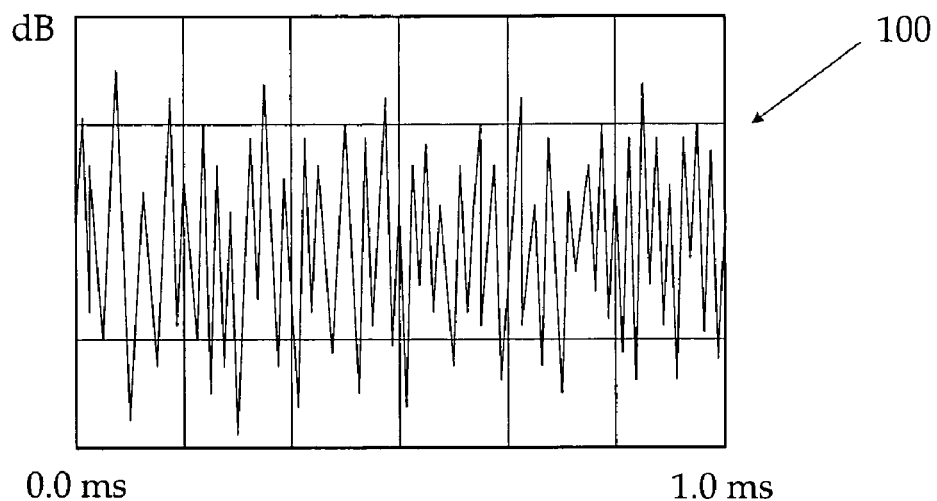
FIG. 1 - Prior Art
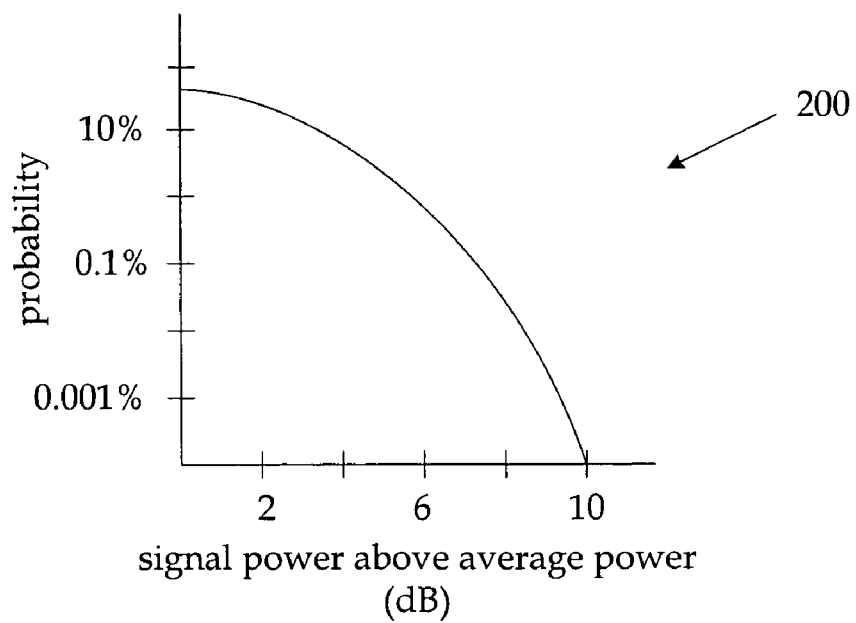
FIG. 2 - Prior Art

METHOD AND SYSTEM FOR ACCELERATING POWER COMPLEMENTARY CUMULATIVE DISTRIBUTION FUNCTION MEASUREMENTS

TECHNICAL FIELD

The invention relates generally to power level measurements, and more particularly to a method and system for accelerating power complementary cumulative distribution function measurements.

BACKGROUND

FIG. 1 illustrates a power versus time plot for a modulated signal according to the prior art. Plot 100 represents the instantaneous power of the signal, with power defined by the equation Power=$I^2+Q^2$. I and Q are the in-phase and quadrature components of the waveform, respectively. Unfortunately, it can be difficult to quantify the signal shown in FIG. 1 due to its inherent randomness and inconsistencies. Consequently, a statistical description of the power levels in the signal is used to extract useful information from the signal.

One such statistical description is a complementary cumulative distribution function curve. FIG. 2 depicts a complementary cumulative distribution function curve according to the prior art. Curve 200 illustrates how much time a signal spends at or above an average power level. The x-axis is scaled to dB above the average power, and the y-axis is the percent of time the signal spends at or above the power level specified by the x-axis. The percent of time the signal spends at or above the average power defines the probability for each power level above the average. For example, in curve 200, the signal power exceeds the average power by at least 6 db approximately one percent of the time.

CCDF curves are utilized in a number of applications that use, generate, or measure modulated signals. These applications include test equipment, communication systems, and electrical components. Because a CCDF curve specifies the power characteristics of a modulated signal, it can help users and designers avoid ambiguity and errors during product design, testing, and integration. The speed at which the measurements are taken and a CCDF curve computed are therefore important to users and designers, since they affect the overall testing and usage of their products.

SUMMARY

In accordance with the invention, a method and system for accelerating power complementary cumulative distribution function measurements is provided. Data values representing the ($I^2+Q^2$) values are converted to floating-point representations and a histogram of the floating-point numbers is generated. The count for each histogram bin in the histogram is stored in a memory. Each floating-point number acts as an address for a corresponding histogram bin in the memory. The accumulated counts in the histogram bins are then grouped into a desired number of CCDF bins, and the CCDF curve is derived from the histogram data. Grouping the histogram bins into the CCDF bins may include combining one or more histogram bins into a single CCDF bin. Linear interpolation is used to divide a count value in a histogram bin between two CCDF bins when the histogram bin does not align with a single CCDF bin.

BRIEF DESCRIPTION OF THE DRAWINGS

The invention will best be understood by reference to the following detailed description of embodiments in accordance with the invention when read in conjunction with the accompanying drawings, wherein:

FIG. 1 illustrates a power versus time plot for a modulated signal according to the prior art;

FIG. 2 depicts a complementary cumulative distribution function curve according to the prior art;

DETAILED DESCRIPTION

The invention relates to a method and system for accelerating power complementary cumulative distribution function measurements. The following description is presented to enable one skilled in the art to make and use the invention, and is provided in the context of a patent application and its requirements. Various modifications to the disclosed embodiments will be readily apparent to those skilled in the art, and the generic principles herein may be applied to other embodiments. Thus, the invention is not intended to be limited to the embodiments shown, but is to be accorded the widest scope consistent with the appended claims and with the principles and features described herein.

Figure 3:
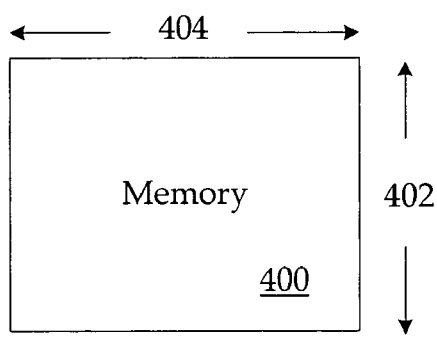
FIG. 3 is a diagram of a floating-point representation in an embodiment in accordance with the invention.

Embodiments in accordance with the invention convert ($I^2+Q^2$) data values to floating-point representations and histogram the floating-point numbers as part of the process of generating a CCDF curve. FIG. 3 is a diagram of a floating-point representation in an embodiment in accordance with the invention. Because the floating-point number 300 represents the magnitude squared data value ($I^2+Q^2$) (i.e., the sum of two squared numbers), the floating-point number 300 is always computed from a positive number in this embodiment in accordance with the invention. Consequently, the floating-point number 300 does not utilize a sign bit. A leading one is included in the mantissa in this embodiment except when the exponent is zero.

With the exponent 302 and the mantissa 304 in the floating-point number 300 containing E and M bits, respectively, and the magnitude squared data value (MS) containing N bits, the floating-point number is computed according to the equations:

exponent=$2^E-1-$(number of leading zeros in MS, up to $2^E-1$)

mantissa=$MS[(N-2^E-1+\exp):(N-2^E+\exp-M)]$ for exp>0; or mantissa=$MS[(N-2^E):(N-2^E+1-M)]$ for exp=0

The floating-point number is then constructed with the exponent as the most significant component and the mantissa as the least significant component. The mantissa references bits in the MS value, where bit (N−1) is the most significant bit and bit 0 is the least significant bit. When the index for the MS bits is negative, bit 0 is set to a zero in this embodiment in accordance with the invention.

Figure 4:
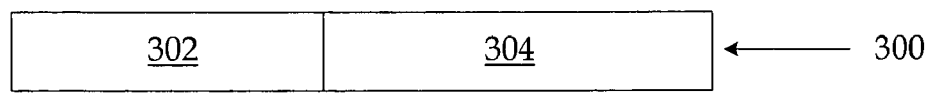
FIG. 4 is a block diagram of a memory that may be utilized with the floating-point representation of FIG. 3.

Referring now to FIG. 4, there is shown a diagram of a memory that may be utilized with the floating-point representation of FIG. 3. Memory 400 is used to accumulate and store counts to histogram the floating-point numbers of $(I^2+Q^2)$. A histogram function counts the floating-point numbers based on the most significant bits in the number. The histogram function uses memory 400 to hold the counts of the histogram bins. Each floating-point number is used as an address for a histogram bin in memory 400.

The total number of bins utilized in the histogram function is based on the depth 402 of memory 400. Since floating-point numbers are used as addresses in this embodiment in accordance with the invention, the number of bits in the floating-point number determines the total number of bins. In particular, the equation $2^{(E+M)}$ calculates the total number of bins, where E and M are the number of bits assigned to the exponent 302 and mantissa 304, respectively. For example, if floating-point number 300 includes a 5-bit exponent 302 and a 9-bit mantissa 304, the number of bins is $2^{14}$, or 16,384 bins.

The maximum count each histogram bin can accumulate is based on the width 404 of memory 400. With a width 404 of w bits, the maximum count is determined by the equation $(2^w-1)$. For example, if memory 400 has a width of 16 bits, the maximum count is $(2^{16}-1)$, or 65,535.

The maximum bin width for each histogram bin is represented by the equation $10 * \log_{10}(1+2^{-M})$ (for exponent>zero), where M is the number of bits in the mantissa 304 of floating-point number 300. Thus, for the example of a 9-bit mantissa, the largest bin width is equal to $(10 * \log_{10}(1+2^{-9}))$, or 0.0085 dB. When the exponent 302 is zero, the bin widths increase in size as the value of the mantissa 304 decreases. Consequently, the floating-point number should be selected to provide a desirable resolution for the CCDF measurements.

The range at which this resolution can be maintained is determined by the equation $(20-10*2^E)*\log_{10}(2)$, where E is the number of bits in the exponent 302 of floating-point number 300. Again, using the example of a 5-bit exponent 302, the range is equal to $((20-10*2^5)*\log_{10}(2))$, or full scale to 90.309 dB below full scale. When designing a histogram function, is desirable to have the range cover all measurement values that may be encountered. The floating-point number 300 should therefore be selected to also provide the desirable range for the CCDF measurements.

Figure 5:
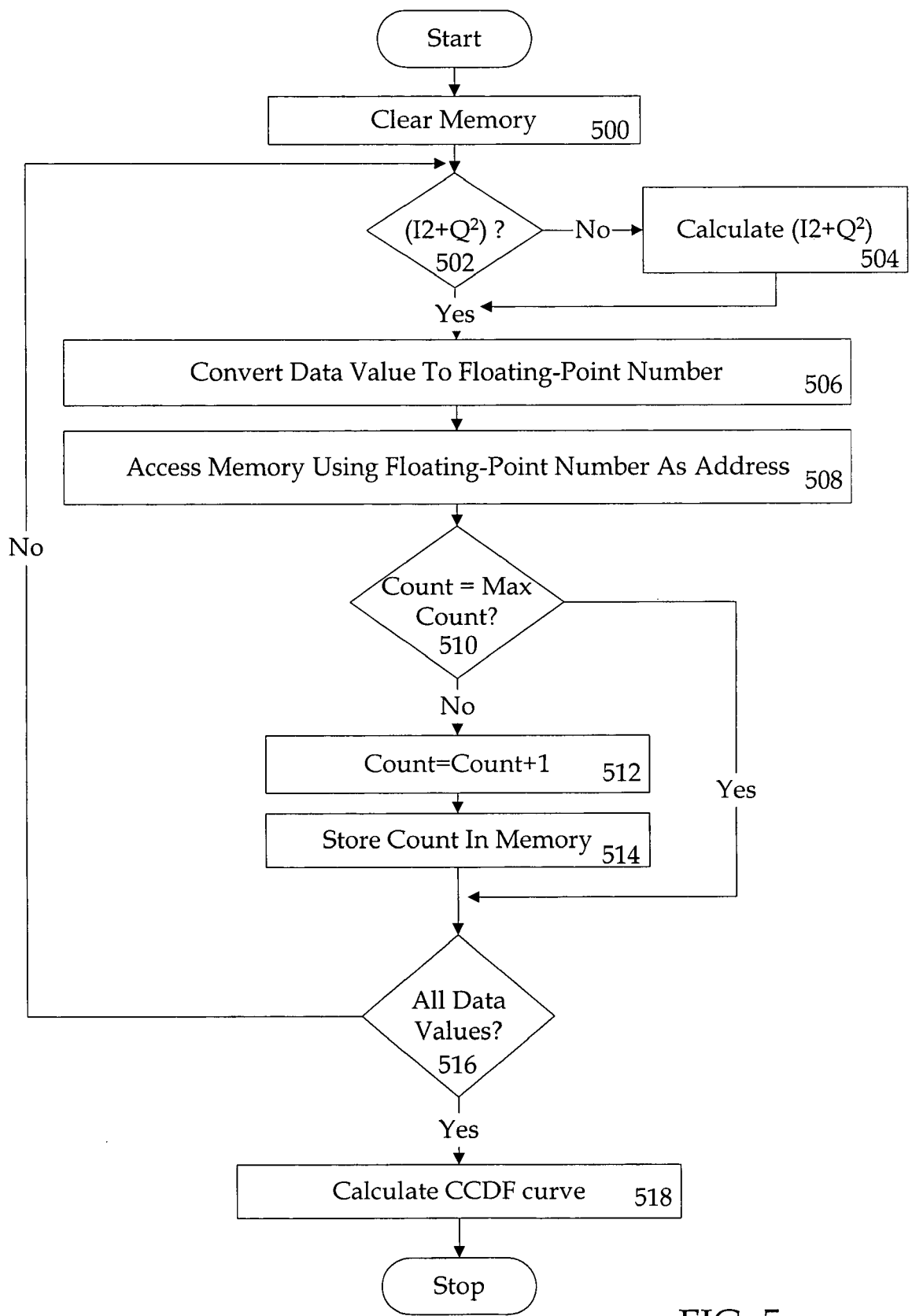
FIG. 5 is a flowchart illustrating a method for accelerating power complementary cumulative distribution function measurements in an embodiment in accordance with the invention.

FIG. 5 is a flowchart illustrating a method for accelerating power complementary cumulative distribution function measurements in an embodiment in accordance with the invention. The process begins at block 500, where the storage locations in a memory are cleared and set to zero. Memory is implemented as a random access memory in the FIG. 5 embodiment. Different types of memory may be used in other embodiments in accordance with the invention.

A determination is then made at block 502 as to whether a data value to be processed is a magnitude squared data value of $(I^2+Q^2)$. If not, the process passes to block 504 where the $(I^2+Q^2)$ data value is calculated. The data value is then converted to a floating-point number, as shown in block 506.

The floating-point number is used as an address for a storage location in memory (block 508). A determination is made at block 510 as to whether a count value stored in that memory location is equal to the maximum allowable count. If not, the process continues at block 512 where the count value is read out of the memory location and incremented by one. The increased count value is then written back into the same memory location, as shown in block 514.

Referring again to block 510, if the count is equal to the maximum count, the process passes to block 516. Consequently, the histogram function clips the accumulation in the FIG. 5 embodiment at the maximum count of a bin when the accumulated number of hits in a bin exceeds the maximum count. In other embodiments in accordance with the invention, the accumulation of counts is allowed to roll over and the rollover amount subsequently added to the maximum count in order to obtain a total count for a particular histogram bin.

A determination is then made at block 516 as to whether all of the data values have been converted to floating-point numbers. If not, the process returns to block 502 and repeats until all of the data values have been converted to floating-point numbers and processed according to the embodiment shown in FIG. 5. When all of the data values have been converted to floating-point numbers, the process continues at block 518 where the CCDF curve is calculated. As part of this calculation, a re-binning process is performed in order to distribute the histogram bins into a desired number of CCDF bins. Linear interpolation is used to divide a count value in a histogram bin between two CCDF bins when the histogram bin does not align with a single CCDF bin. Additional calculations performed to derive a CCDF curve are discussed in conjunction with FIG. 6.

Blocks 500 through 516 are performed in hardware in this embodiment in accordance with the invention, while block 518 is performed in a host system. Exemplary hardware systems that may implement the method of FIG. 5 are described in conjunction with FIGS. 8-10. Processing of the various blocks can be allocated differently in other embodiments in accordance with the invention.

Figure 6:
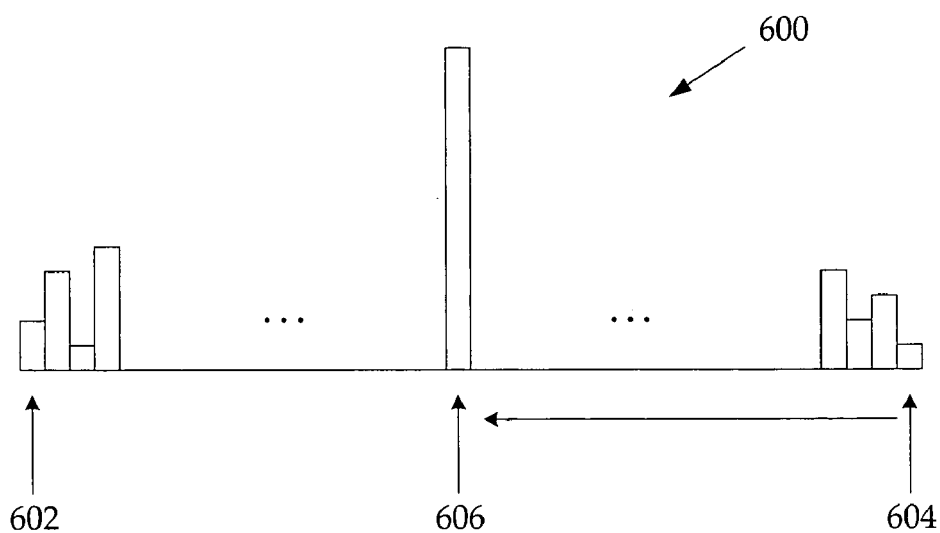
FIG. 6 illustrates a histogram in accordance with an embodiment of the invention.

FIG. 6 is a histogram in accordance with an embodiment of the invention. Histogram 600 represents the frequency distribution of the floating-point numbers, and includes a minimum bin 602, a maximum bin 604, and an average of the count 606. FIG. 6 illustrates only a limited number of bins in histogram 600, with the ellipses indicating additional bins exist between bins 602 and 606 and between bins 604 and 606.

The average of the count 606 represents the average power in this embodiment in accordance with the invention. The average power is calculated according to the equation:

$$\text{Average power} = \Sigma(P_i * C_i) / \Sigma(C_i), \text{ for } i = 1 \text{ to } K, K = \text{number of bins}, P_i \text{ is the power for the } i\text{th bin}, \text{ and } C_i \text{ is the count for the } i\text{th bin}$$

To obtain the power/average power values for a CCDF curve, a reverse integration of the values between the maximum count bin 604 and the average power 606 is performed (illustrated by the arrow between bins 604 and 606). The percentages for the CCDF curve are obtained by dividing the results of the reverse integration by the total number of data values converted to floating-point numbers, which is defined by $\Sigma(C_i)$ for i=1 to K.

Figure 7:
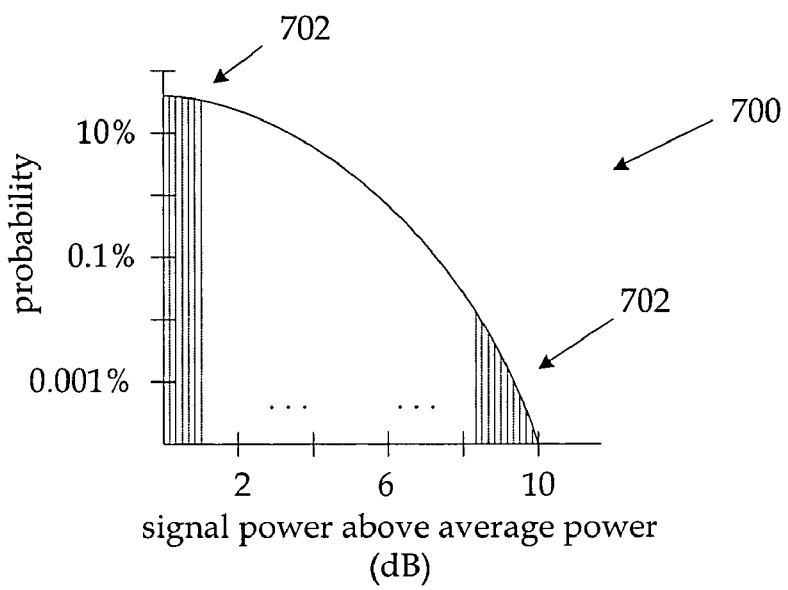
FIG. 7 depicts a complementary cumulative distribution function curve in an embodiment in accordance with the invention.

Referring now to FIG. 7, there is shown a complementary cumulative distribution function curve in an embodiment in accordance with the invention. CCDF curve 700 is divided into CCDF bins 702 through the re-binning process described in conjunction with block 518 in FIG. 5. As discussed earlier, linear interpolation is used to divide a count value in a histogram bin between two CCDF bins when the histogram bin does not align with a single CCDF bin.

Figure 8:
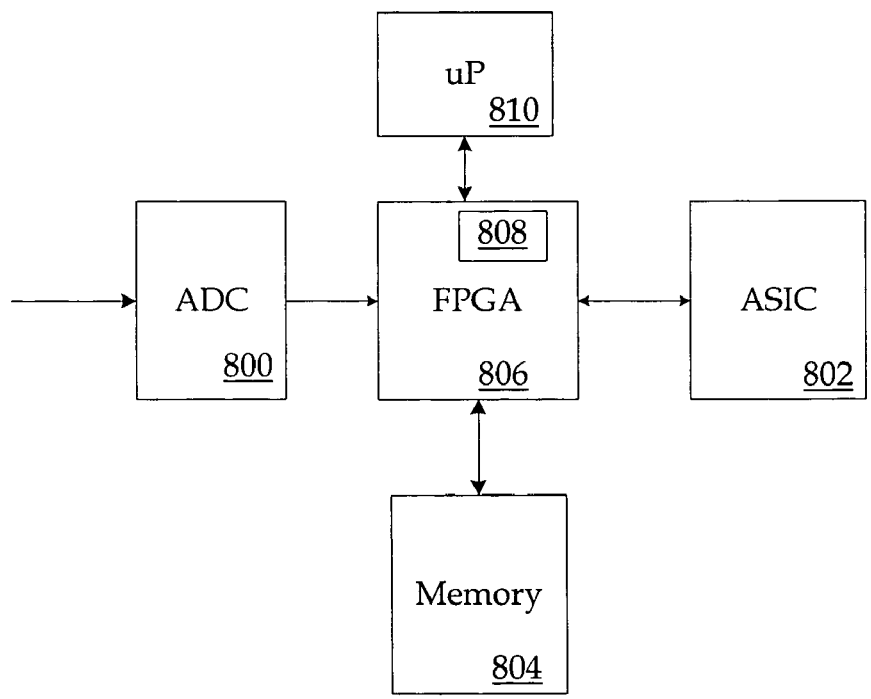
FIG. 8 is a block diagram of a first system that may be used to accelerate power complementary cumulative distribution function measurements in an embodiment in accordance with the invention.

FIG. 8 is a block diagram of a first system that may be used to accelerate power complementary cumulative distribution function measurements in an embodiment in accordance with the invention. The system includes an analog-to-digital converter (ADC) 800, an application-specific integrated circuit (ASIC) 802, a memory 804, a field programming gate array (FPGA) 806 with an internal memory 808, and a microprocessor 810. An analog IF (Immediate Frequency) signal is received by the ADC 800 and converted to a digital IF signal. The digital IF signal is down-converted and calibrated to baseband I and Q data values by ASIC 802 and FPGA 806. FPGA 806 is also used to calculate the $(I^2+Q^2)$ data values in this embodiment in accordance with the invention.

Memory 804 can be used to buffer I and Q data values and/or $(I^2+Q^2)$ data values. The data values to be processed by FPGA 806 can be transferred to FPGA 806 by ADC 800 or, if buffered in memory 804, by memory 804. In this embodiment, FPGA 806 performs the floating-point number conversions and the histogram function. Memory 808 is utilized to accumulate and store data values to histogram the floating-point numbers.

The histogram counts are then transferred to a host processor (not shown) in this embodiment in accordance with the invention. The host processor performs all subsequent calculations to derive the CCDF curve. In other embodiments in accordance with the invention, derivation of the CCDF curve may be performed by the FPGA 806 and the microprocessor 810. The processed CCDF curve data are then transferred to the host processor.

Figure 9:
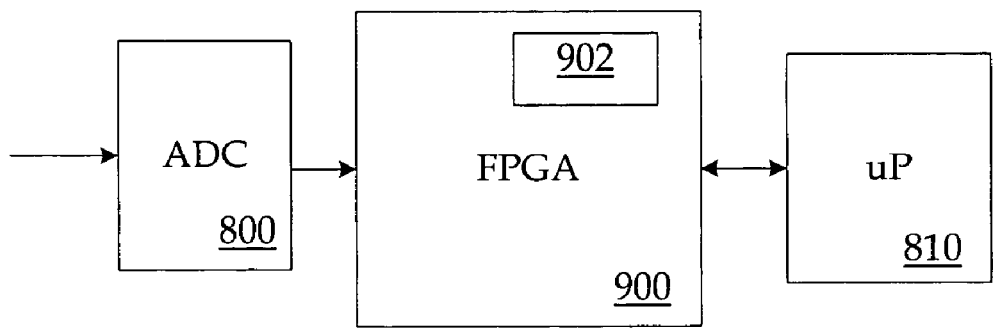
FIG. 9 is a block diagram of a second system that may be used to accelerate power complementary cumulative distribution function measurements in an embodiment in accordance with the invention.

Referring now to FIG. 9, there is shown a block diagram of a second system that may be used to accelerate power complementary cumulative distribution function measurements in an embodiment in accordance with the invention. The system includes the ADC 800, microprocessor 810, FPGA 900, and memory 902. Analog data are received by the ADC 800 and converted to digital data. In the FIG. 9 embodiment, the digital data includes the $(I^2+Q^2)$ values. In other embodiments in accordance with the invention, the digital data may include calibrated I and Q values and FPGA 900 is used to calculate the $(I^2+Q^2)$ values.

The data are then transferred to the FPGA 900. FPGA 900 performs the floating-point number conversions and the histogram function. Memory 902 is utilized to accumulate and store data values to histogram the floating-point numbers. The histogram counts are then transferred to a host processor (not shown) in this embodiment in accordance with the invention. The host processor performs all subsequent calculations to derive the CCDF curve. In other embodiments in accordance with the invention, derivation of the CCDF curve may be performed by the FPGA 900 and the microprocessor 810. The processed CCDF curve data are then transferred to the host processor.

Figure 10:
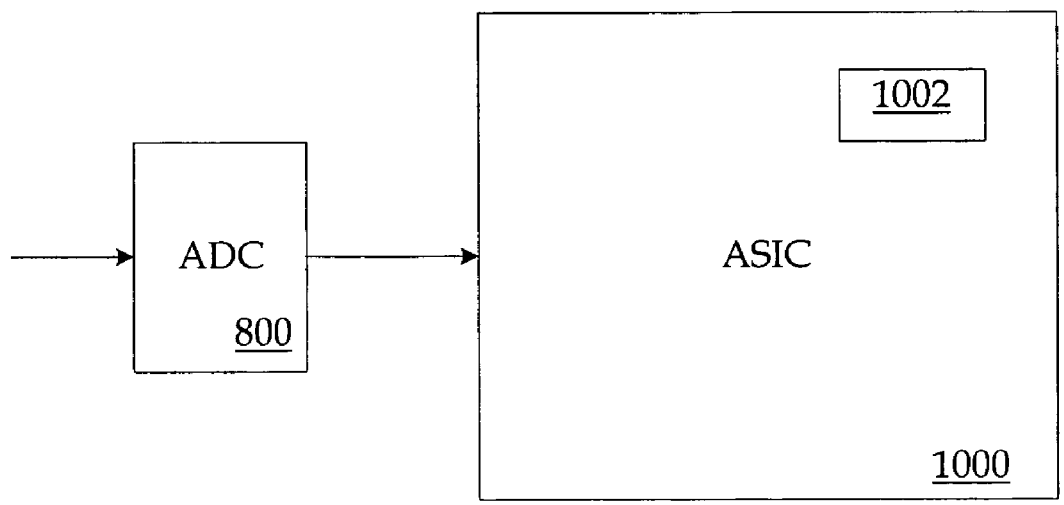
FIG. 10 is a block diagram of a third system that may be used to accelerate power complementary cumulative distribution function measurements in an embodiment in accordance with the invention.

FIG. 10 is a block diagram of a third system that may be used to accelerate power complementary cumulative distribution function measurements in an embodiment in accordance with the invention. The system includes ADC 800 and ASIC 1000. Analog data is received by the ADC 800 and converted to digital data. In the FIG. 10 embodiment, the digital data includes the $(I^2+Q^2)$ values. In other embodiments in accordance with the invention, the digital data may include the calibrated I and Q values and ASIC 1000 is used to calculate the $(I^2+Q^2)$ values.

The digital data are input into ASIC 1000. The floating-point number conversions and the histogram function are performed by ASIC 1000. Memory 1002 is used to accumulate and store data values to histogram the floating-point numbers. The histogram counts are then transferred to a host processor (not shown) in this embodiment in accordance with the invention. The host processor performs all subsequent calculations to derive the CCDF curve. In other embodiments in accordance with the invention, derivation of the CCDF curve may be performed by the ASIC 1000. The processed CCDF curve data are then transferred to the host processor.

Those skilled in the art will appreciate that by performing the histogram function in hardware the time needed to compute the CCDF curve is reduced. The histogram function is generated quickly because the floating-point numbers are used as addresses for memory and the counts stored in the memory locations incremented by one. These two tasks are performed very efficiently in hardware. Additionally, the amount of data transferred to a host system is reduced, as is the amount of data used to derive a CCDF curve. This is because the histogram data are processed and not the large number of I and Q or $(I^2+Q^2)$ data values.

The invention claimed is:

1. A system for generating a histogram of a plurality of power data values, the system comprising:
   a processing apparatus receiving the plurality of power data values and converting the plurality of power data values to a plurality of floating-point numbers; and
   a memory including a plurality of histogram bins connected electronically to the processing apparatus, wherein the processing apparatus stores counts of the plurality of floating-point numbers using each floating-point number as an address for a corresponding histogram bin in the memory.

2. The system of claim 1, wherein the plurality of power data values comprise a plurality of $(I^2+Q^2)$ data values, wherein each $(I^2+Q^2)$ data value represents a power value of a signal.

3. The system of claim 2, wherein an exponent and a mantissa in the plurality of floating-point numbers are computed according to the equations:

$$\text{exponent}=2^E-1-(\text{number of leading zeros in } MS, \text{ up to } 2^E-1)$$

$$\text{mantissa}=MS[(N-2^E-1+\exp):(N-2^E+\exp-M)] \text{ for } \exp>0; \text{ or}$$

$$\text{mantissa}=MS[(N-2^E):(N-2^E+1-M)] \text{ for } \exp=0$$

where E is the number of bits assigned to the exponent, M is the number of bits assigned to the mantissa, MS is a respective $(I^2+Q^2)$ data value in the plurality of $(I^2+Q^2)$ data values, and N is the number of bits assigned to the plurality of $(I^2+Q^2)$ data values.

4. The system of claim 3, wherein the total number of histogram bins in the memory is determined by the equation $2^{(E+M)}$.

5. The system of claim 3, wherein a maximum bin width for the histogram bins is determined by the equation $10*\log_{10}(1+2^{-M})$.

6. The system of claim 3, wherein a range of histogram bins is determined by the equation $(20-10*2^E)*\log_{10}(2)$.

7. The system of claim 1, wherein a maximum count for the histogram bins is determined by the equation $(2^w-1)$, where w represents a bit width of the memory.

8. The system of claim 2, wherein the processing apparatus comprises:
a field programmable gate array receiving the plurality of $(I^2+Q^2)$ data values; and
a microprocessor connected electronically to the field programmable gate array, wherein the field programmable gate array and the microprocessor work cooperatively to convert each $(I^2+Q^2)$ data value to a floating-point number and store counts of the plurality of floating-point numbers using each floating-point number as an address for a corresponding histogram bin in the memory.

9. The system of claim 1, wherein the processing apparatus comprises:
an analog to digital converter receiving an analog immediate frequency signal and converting to a digital immediate frequency signal;
an application specific integrated circuit receiving the digital immediate frequency signal, down-converting the immediate frequency signal to a baseband signal including a plurality of I and Q data values, and calculating the plurality of power data values comprised of a plurality of $(I^2+Q^2)$ data values;
a field programmable gate array receiving the plurality of $(I^2+Q^2)$ data values; and
a microprocessor connected electronically to the field programmable gate array, wherein the field programmable gate array and the microprocessor work cooperatively to convert each $(I^2+Q^2)$ data value to a floating-point number and store counts of the plurality of floating-point numbers using each floating-point number as an address for a corresponding histogram bin in the memory.

10. The system of claim 1, wherein the processing apparatus comprises:
an analog to digital converter receiving an analog immediate frequency signal and converting to a digital immediate frequency signal; and
an application specific integrated circuit receiving the digital immediate frequency signal, down-converting the immediate frequency signal to a baseband signal including a plurality of I and Q data values, calculating the plurality of power data values comprised of a plurality of $(I^2+Q^2)$ data values, converting each $(I^2+Q^2)$ data value to a floating-point number, and storing counts of the plurality of floating-point numbers using each floating-point number as an address for a corresponding histogram bin in the memory, wherein each $(I^2+Q^2)$ data value represents a power value of the signal.

11. The system of claim 2, wherein the processing apparatus comprises:
an analog to digital converter receiving a plurality of analog power data values and converting to a plurality of digital power data values comprised of $(I^2+Q^2)$ data values; and
an application specific integrated circuit converting each $(I^2+Q^2)$ data value to a floating-point number and storing counts of the plurality of floating-point numbers using each floating-point number as an address for a corresponding histogram bin in the memory.

12. A method for deriving a power complementary cumulative distribution function (CCDF) from a plurality of power data values, comprising:
a) receiving a power data value;
b) converting the power data value to a floating-point number;
c) reading a location in a memory using the floating-point number as an address for the location in memory;
d) incrementing by one a count read from the location in memory;
e) writing the incremented count to the location in memory; and
f) repeating a through e until all of the power data values in the plurality of power data values have been received, converted, and accumulated in corresponding locations in memory; and
g) generating a histogram of the plurality of floating-point numbers using the memory locations as histogram bins.

13. The method of claim 12, further comprising calculating a complementary cumulative distribution function curve from the histogram.

14. The method of claim 13, wherein calculating a complementary cumulative distribution function curve from the histogram comprises calculating an average power for the plurality of power data values according to the equation average power=$\Sigma(P_i*C_i)/\Sigma(C_i)$, for i=1 to K, and K=number of bins, $P_i$ is the power for the ith bin, and $C_i$ is the count for the ith bin.

15. The method of claim 14, wherein calculating a complementary cumulative distribution function curve from the histogram comprises grouping the counts in the histogram bins into a plurality of CCDF bins.

16. The method of claim 15, further comprising:
performing linear interpolation on a count in a histogram bin when the count is divided between two CCDF bins.

17. The method of claim 12, wherein the plurality of power data values comprise a plurality of $(I^2+Q^2)$ data values.

18. The method of claim 17, wherein converting the power data value to a floating-point number comprises computing an exponent and a mantissa for a floating-point number according to the equations:

exponent=$2^E-1$-(number of leading zeros in MS, up to $2^E-1$)

mantissa=$MS[(N-2^E-1+\exp):(N-2^E+\exp-M)]$ for exp>0; or mantissa=$MS[(N-2^E):(N-2^E+1-M)]$ for exp=0 where E is the number of bits assigned to the exponent, M is the number of bits assigned to the mantissa, MS is a respective $(I^2+Q^2)$ data value in the plurality of $(I^2+Q^2)$ data values, and N is the number of bits assigned to the power data value.

19. The method of claim 18, wherein the total number of histogram bins in the memory is determined by the equation $2^{(E+M)}$, a maximum bin width is determined by the equation $10*\log_{10}(1+2^{-M})$, and a range of histogram bins is determined by the equation $(20-10*2^E)*\log_{10}(2)$.

20. The method of claim 12, wherein a maximum count each histogram bin in the memory can accumulate is determined by the equation $(2^w-1)$, where w represents a bit width of the memory.

* * * * *

UNITED STATES PATENT AND TRADEMARK OFFICE
CERTIFICATE OF CORRECTION

PATENT NO. : 7,058,540 B2
APPLICATION NO. : 10/737050
DATED : June 6, 2006
INVENTOR(S) : He et al.

It is certified that error appears in the above-identified patent and that said Letters Patent is hereby corrected as shown below:

In column 6, line 53, in Claim 3, delete "exponent-$2^E$" and insert -- exponent=$2^E$ --, therefor.

In column 7, line 31, in Claim 9, after "values" insert -- , wherein each ($I^2+Q^2$) data value represents a power value of the signal --.

Signed and Sealed this

Eleventh Day of September, 2007

JON W. DUDAS
*Director of the United States Patent and Trademark Office*